(12) United States Patent
Hyakutake et al.

(10) Patent No.: US 9,027,573 B2
(45) Date of Patent: May 12, 2015

(54) SUBSTRATE PROCESSING APPARATUS FOR MAINTAINING A MORE UNIFORM TEMPERATURE DURING SUBSTRATE PROCESSING

(75) Inventors: Hironobu Hyakutake, Koshi (JP); Shinichiro Shimomura, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 978 days.

(21) Appl. No.: 13/115,416

(22) Filed: May 25, 2011

(65) Prior Publication Data
US 2011/0290279 A1    Dec. 1, 2011

(30) Foreign Application Priority Data

May 31, 2010  (JP) ................................. 2010-124366
May 11, 2011  (JP) ................................. 2011-106422

(51) Int. Cl.
*H01L 21/00* (2006.01)
*H01L 21/67* (2006.01)

(52) U.S. Cl.
CPC .... *H01L 21/67109* (2013.01); *H01L 21/67086* (2013.01)

(58) Field of Classification Search
CPC ................... H01L 21/67109; H01L 21/67103; H01L 21/67086
USPC ............... 134/105, 18, 19, 56 R; 156/345.27, 156/345.11
See application file for complete search history.

(56) References Cited

U.S. PATENT DOCUMENTS

| | | | |
|---|---|---|---|
| 5,239,614 A * | 8/1993 | Ueno et al. | 392/416 |
| 5,383,984 A * | 1/1995 | Shimada et al. | 156/345.26 |
| 6,399,517 B2 | 6/2002 | Yokomizo et al. | |
| 6,780,277 B2 | 8/2004 | Yokomizo et al. | |
| 2005/0011537 A1* | 1/2005 | Toshima et al. | 134/19 |

FOREIGN PATENT DOCUMENTS

| | | |
|---|---|---|
| JP | H04-357835 | 12/1992 |
| JP | H05-190523 | 7/1993 |
| JP | H08-017782 | 1/1996 |
| JP | 2001-023952 A1 | 1/2001 |

* cited by examiner

*Primary Examiner* — Michael Barr
*Assistant Examiner* — Irina Graf
(74) *Attorney, Agent, or Firm* — Burr & Brown, PLLC

(57) ABSTRACT

A substrate processing apparatus that includes a process tank having a pair of opposed sidewalls for storing a chemical liquid, and processing a plurality of substrates by the chemical liquid; a substrate holding mechanism including a holding part for holding the plurality of substrates, and a back part connected to the holding part and interposed between the substrates held by the holding part and one sidewall of the pair of opposed sidewalls when the substrate holding mechanism is loaded into the process tank. A heating device is disposed on the process tank for heating the stored chemical liquid. The heating device includes at least a first heater disposed on the one sidewall, and a second heater disposed on the other sidewall of the pair of opposed sidewalls. Energy outputs of the first heater and the second heater are independently controlled.

12 Claims, 6 Drawing Sheets

SUBSTRATE PROCESSING APPARATUS FOR MAINTAINING A MORE UNIFORM TEMPERATURE DURING SUBSTRATE PROCESSING

CROSS REFERENCE TO RELATED APPLICATIONS

This application is based upon and claims the benefit of priority from the prior Japanese Patent Application No. 2010-124366 filed on May 31, 2010, and Japanese Patent Application No. 2011-106422 filed on May 11, 2011, the entire contents of which are incorporated herein by reference.

BACKGROUND OF THE INVENTION

1. Field of the Invention

The present invention relates to a substrate processing apparatus for processing substrates, a substrate processing method, and a storage medium storing a computer program for performing the substrate processing method.

2. Description of Related Art

There has been known a substrate processing apparatus that subjects a substrate, such as a semiconductor wafer (hereinafter referred to simply as "wafer"), to a chemical liquid process (etching process) by immersing the wafer into a chemical liquid (etching liquid) stored in a process tank (see, JP2001-23952A, for example). In such a substrate processing apparatus, a plurality of (e.g., fifty) wafers each having a silicon nitride film formed on a surface thereof are immersed into a boiling chemical liquid (e.g., phosphoric acid solution, $H_3Po_4$) at a high temperature (e.g., about 160° C. to about 180° C.) stored in a process tank, so that the silicon nitride film of each wafer is etched. Thus, the silicon nitride film on the surface of the wafer is formed into a desired pattern.

The process tank is of a rectangular parallelepiped shape, and has four sidewalls and a bottom plate. Heaters are provided on the respective sidewalls and the bottom plate. Thus, the chemical liquid stored in the process tank can be heated before wafers are immersed thereinto and while the wafer is being immersed therein.

In addition, the substrate processing apparatus is provided with a wafer board including a holding rod for holding a plurality of wafers in a standing state (in a vertical state), and a back plate connected to the holding rod and extending vertically. Wafers are held by the holding rod of the wafer board, and are immersed into the chemical liquid that is heated in the boiling state.

SUMMARY OF THE INVENTION

However, heat of the chemical liquid around the back plate of the wafer board is drawn by the back plate, and transfer of the heat is blocked by the back plate. Thus, the temperature of the chemical liquid around the wafer, which is held by the holding rod on the side of the back plate among the wafers held by the holding rod, is lowered, so that the temperature of the chemical liquid and the boiling state thereof differ from a position near to the distal end of the holding rod to a position near to the back plate. Since an etching rate (etching speed) of the silicon nitride film of the wafer depends on the temperature of the chemical liquid, and the boiling state of the chemical liquid depends on a selection ratio of $SiN_k$ and $SiO_k$. Thus, there is a possibility that an etching rate of the silicon nitride film of the wafer held on, the side of the back plate of the holding rod of the wafer board is deteriorated, which makes it difficult to uniformly etch the silicon nitride films of the respective wafers held by the wafer board.

The present invention has been made in view of the above circumstances. The object of the present invention is to provide a substrate processing apparatus, a substrate processing method, and a storage medium storing a computer program for performing the substrate processing method, which are capable of making uniform a temperature of a chemical liquid in a process tank and a boiling state thereof during a chemical liquid process, whereby a plurality of substrates are uniformly processed by the chemical liquid.

The present invention is a substrate processing apparatus comprising: a process tank including a pair of opposed sidewalls, the process tank being configured to store a chemical liquid therein and to process a plurality of substrates by the chemical liquid; a substrate holding mechanism including a holding part configured to hold the plurality of substrates in a standing state, and a back part connected to the holding part, the back part being interposed between the substrates held by the holding part and one of the pair of sidewalls of the process tank when the substrate holding mechanism is loaded into the process tank, the substrate holding mechanism being configured to immerse the substrates held by the holding part into the chemical liquid; and a heating device disposed on the process tank, the heating device being configured to heat the stored chemical liquid; wherein: the heating device includes a first heating device disposed on the one sidewall of the process tank, and a second heating device disposed on the other sidewall thereof; a control unit is connected to the first heating device and the second heating device; and the control unit is configured to independently control an output of the first heating device and an output of the second heating device.

In the above substrate processing apparatus, it is preferable that the control unit is configured to control the first heating device and the second heating device such that the output of the first heating device is larger than the output of the second heating device, so as to heat the chemical liquid stored in the process tank.

In addition, in the above substrate processing apparatus, it is preferable that the process tank further includes two other sidewalls and a bottom part; that third heating devices are disposed respectively on the two other sidewalls and the bottom part of the process tank; and that the control unit is configured to control the first heating device and the second heating device such that the output of the first heating device and the output of the second heating device are respectively maintained constant, and to control the third heating devices such that a temperature of the chemical liquid stored in the process tank becomes a desired temperature.

In addition, in the above substrate processing apparatus, it is preferable that a temperature detecting device configured to detect the temperature of the stored chemical liquid is disposed in the process tank, and that the control unit is configured to control the third heating devices based on the temperature detected by the temperature detecting device.

In addition, in the above substrate processing apparatus, which includes the previously described two other sidewalls and the bottom part; that third heating devices are disposed respectively on the two other sidewalls and the bottom part of the process tank; and that the control unit is configured to control the third heating devices such that outputs of the third heating devices are maintained constant, and to control the first heating device and the second heating device such that a temperature of the chemical liquid stored in the process tank becomes a desired temperature.

In addition, in the above substrate processing apparatus, it is preferable that a temperature detecting device configured to detect the temperature of the stored chemical liquid is disposed in the process tank, and that the control unit is configured to control the first heating device and the second heating device based on the temperature detected by the temperature detecting device.

In addition, in the above substrate processing apparatus, it is preferable that the control unit is configured to control the first heating device and the third heating devices such that outputs of the third heating devices are substantially the same as the output of the first heating device.

In addition, in the above substrate processing apparatus, it is preferable that the control unit is configured to control the first heating device and the third heating devices such that outputs of the third heating devices are larger than the output of the first heating device.

In addition, the above substrate processing apparatus preferably further comprises a chemical-liquid supply part disposed in the process tank, the chemical-liquid supply part being configured to supply a chemical liquid to the substrates immersed in the chemical liquid, wherein: a plurality of holding grooves capable of being engaged with the substrates are formed in the holding part of the substrate holding mechanism; and the chemical-liquid supply part includes: a plurality of substrate position supply holes arranged so as to correspond to gaps between the holding grooves, the substrate position supply holes being configured to supply the chemical liquid to gaps between the substrates; and a back-part side supply hole arranged so as to correspond to a gap between the holding groove, which is formed closest to the back part among these holding grooves, and the one sidewall, the back-part side supply hole being configured to supply the chemical liquid to a gap between the substrate, which is engaged with the holding groove located closest to the back part, and the one sidewall.

In addition, in the above substrate processing apparatus, it is preferable that the control unit is configured to control the first heating device and the second heating device such that the output of the first heating device is smaller than the output of the second heating device, so as to heat the chemical liquid stored in the process tank.

In addition, in the above substrate processing apparatus, it is preferable that the control unit controls the first heating device and the second heating device such that the output of the first heating device relative to the output of the second heating device is 30% to 50%.

The present invention is a substrate processing method for processing a substrate by using a substrate processing apparatus comprising: a process tank including a pair of opposed sidewalls, the process tank being configured to store a chemical liquid therein and to process a plurality of substrates by the chemical liquid; a substrate holding mechanism including a holding part configured to hold the plurality of substrates in a standing state, and a back part connected to the holding part, the back part being interposed between the substrates held by the holding part and one of the pair of sidewalls of the process tank when the substrate holding mechanism is loaded into the process tank, the substrate holding mechanism being configured to immerse the substrates held by the holding part into the chemical liquid; and a heating device disposed on the process tank, the heating device being configured to heat the stored chemical liquid; wherein the heating device includes a first heating device disposed on the one sidewall of the process tank, and a second heating device disposed on the other sidewall thereof; the substrate processing method comprising: storing the process tank with a chemical liquid; heating the chemical liquid stored in the process tank, while independently controlling an output of the first heating device and an output of the second heating device; and immersing a plurality of substrates into the chemical liquid stored in the process tank, the substrates being held in a standing state by the holding part of the substrate holding mechanism.

In the above substrate processing method, it is preferable that in the heating of the chemical liquid, the chemical liquid stored in the process tank is heated, while the output of the first heating device is larger than the output of the second heating device.

In addition, in the above substrate processing method, it is preferable that the process tank further includes two other sidewalls and a bottom part; that third heating devices are disposed respectively on the two other sidewalls and the bottom part of the process tank; and that in the heating of the chemical liquid, the outputs of the first heating device and the second heating device are respectively maintained constant, and the third heating devices are operated such that a temperature of the chemical liquid stored in the process tank becomes a desired temperature.

In addition, in the above substrate processing method, it is preferable that in the heating of the chemical liquid, the temperature of the chemical liquid stored in the process tank is detected, and the third heating devices are operated based on the detected temperature.

In addition, in the above substrate processing method, it is preferable that the process tank further includes two other sidewalls and a bottom part; that third heating devices are disposed respectively on the two other sidewalls and the bottom part of the process tank; and that in the heating of the chemical liquid, outputs of the third heating devices are maintained constant, and the first heating device and the second heating devices are operated such that a temperature of the chemical liquid stored in the process tank becomes a desired temperature.

In addition, in the above substrate processing method, it is preferable that in the heating of the chemical liquid, the temperature of the chemical liquid stored in the process tank is detected, and the first heating device and the second heating device are operated based on the detected temperature.

In addition, in the above substrate processing method, it is preferable that in the heating of the chemical liquid, outputs of the third heating devices are substantially the same as the output of the first heating device.

In addition, in the above substrate processing method, it is preferable that in the heating of the chemical liquid, outputs of the third heating devices are larger than the output of the first heating device.

In addition, in the above substrate processing method, it is preferable that a chemical-liquid supply part configured to supply a chemical liquid to the substrates immersed in the chemical liquid is disposed in the process tank; that a plurality of holding grooves capable of being engaged with the substrates are formed in the holding part of the substrate holding mechanism; that the chemical-liquid supply part includes: a plurality of substrate position supply holes arranged so as to correspond to gaps between the holding grooves, the substrate position supply holes being configured to supply the chemical liquid to gaps between the substrates; and a back-part side supply hole arranged so as to correspond to a gap between the holding groove, which is formed closest to the back part among these holding grooves, and the one sidewall, the back-part side supply hole being configured to supply the chemical liquid to a gap between the substrate, which is engaged with the holding groove located closest to the back part, and the one sidewall; and that in the immersing of the substrates into the chemical liquid, the chemical liquid is supplied to the gaps between the substrate immersed in the chemical liquid, and is supplied to the gap between the substrate, which is engaged with the holding groove located closest to the back part, and the one sidewall.

In addition, in the above substrate processing method, it is preferable that in the heating of the chemical liquid, the chemical liquid stored in the process tank is heated while the output of the first heating device is smaller than the output of the second heating device.

In addition, in the above substrate processing method, it is preferable that in the heating of the chemical liquid, the chemical liquid stored in the process tank is heated, while the output of the first heating device relative to the output of the second heating device is 30% to 50%.

The present invention is a storage medium storing a computer program for performing a substrate processing method for processing a substrate by using a substrate processing apparatus comprising: a process tank including a pair of opposed sidewalls, the process tank being configured to store a chemical liquid therein and to process a plurality of substrates by the chemical liquid; a substrate holding mechanism including a holding part configured to hold the plurality of substrates in a standing state, and a back part connected to the holding part, the back part being interposed between the substrates held by the holding part and one of the pair of sidewalls of the process tank when the substrate holding mechanism is loaded into the process tank, the substrate holding mechanism being configured to immerse the substrates held by the holding part into the chemical liquid; and a heating device disposed on the process tank, the heating device being configured to heat the stored chemical liquid; wherein the heating device includes a first heating device disposed on the one sidewall of the process tank, and a second heating device disposed on the other sidewall thereof; the substrate processing method comprising: storing the process tank with a chemical liquid; heating the chemical liquid stored in the process tank, while independently controlling an output of the first heating device and an output of the second heating device; and immersing a plurality of substrates into the chemical liquid stored in the process tank, the substrates being held in a standing state by the holding part of the substrate holding mechanism.

According to the present invention, it is possible to make uniform the temperature of the chemical liquid in the process tank and the boiling state thereof during the chemical-liquid process, whereby the plurality of substrates can be uniformly processed by the chemical liquid.

DETAILED DESCRIPTION OF THE INVENTION

First Embodiment

Embodiments according to the present invention will be described herebelow with reference to the drawings. FIGS. 1 to 4 are views for explaining a substrate processing apparatus in a first embodiment according to the present invention, a substrate processing method, and a storage medium storing a computer program for performing the substrate processing method.

At first, an overall structure of the substrate processing apparatus 1 is described with reference to FIG. 1.

Figure 1:
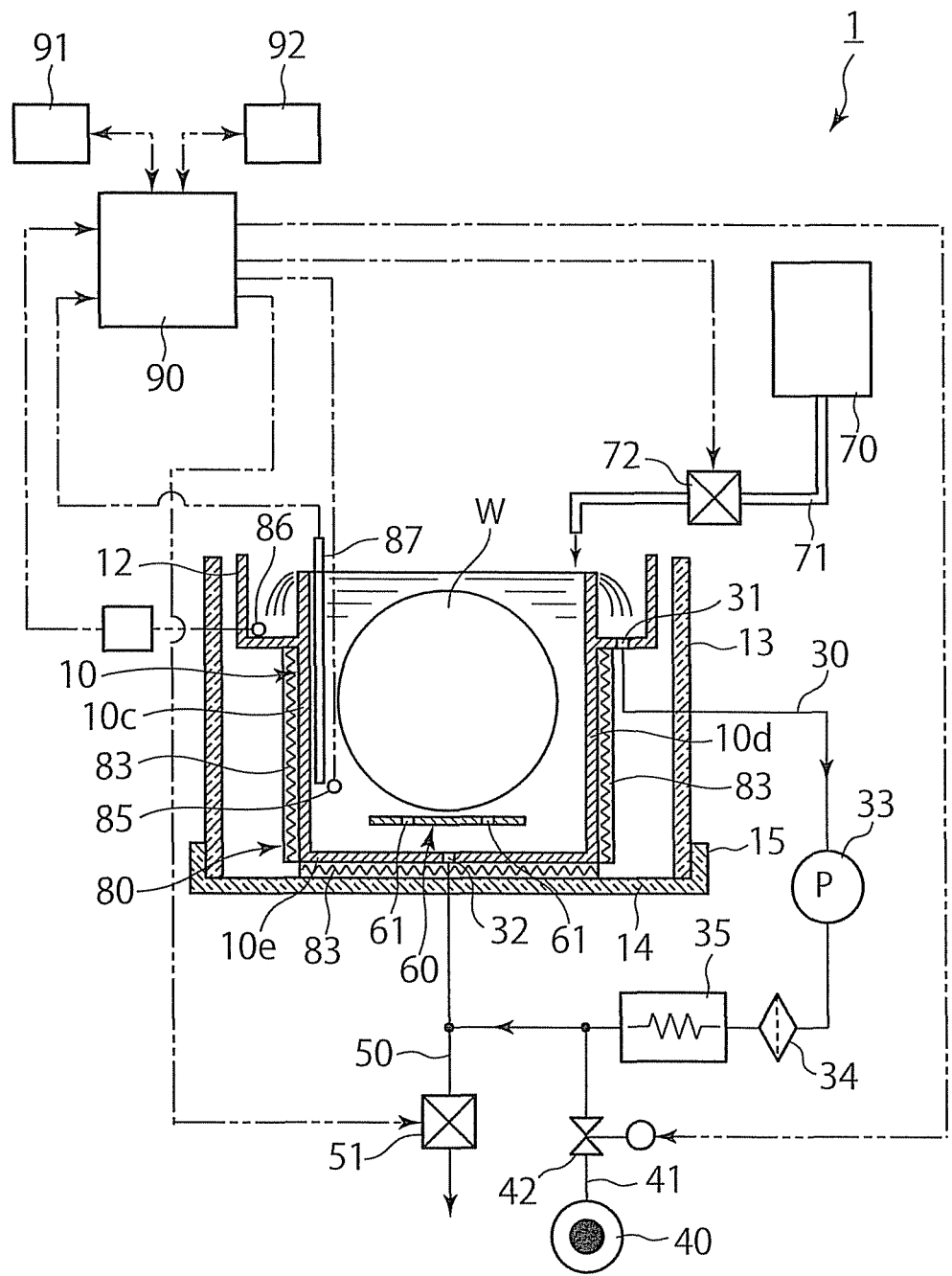
FIG. 1 is a view showing an overall structure of a substrate processing apparatus in a first embodiment according to the present invention.
Figure 2:
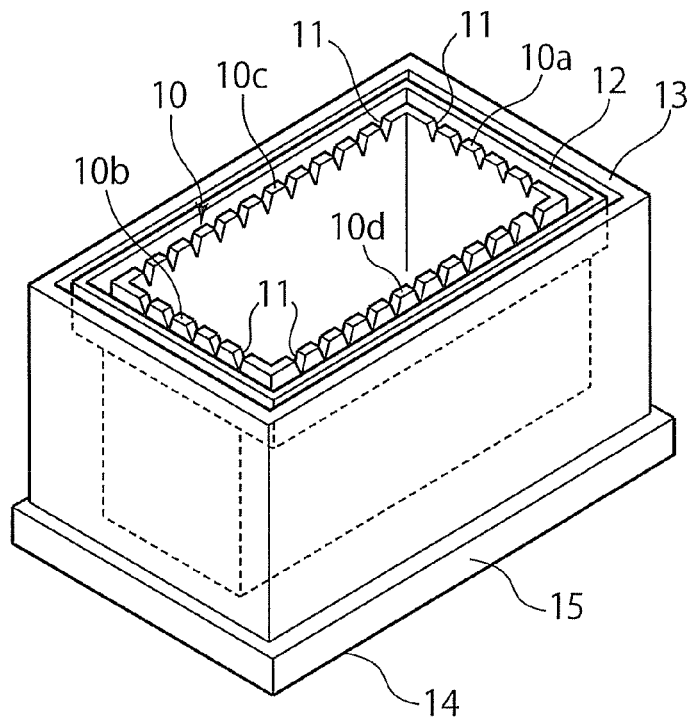
FIG. 2 is a perspective view showing a process tank of the substrate processing apparatus in the first embodiment according to the present invention.
Figure 3:
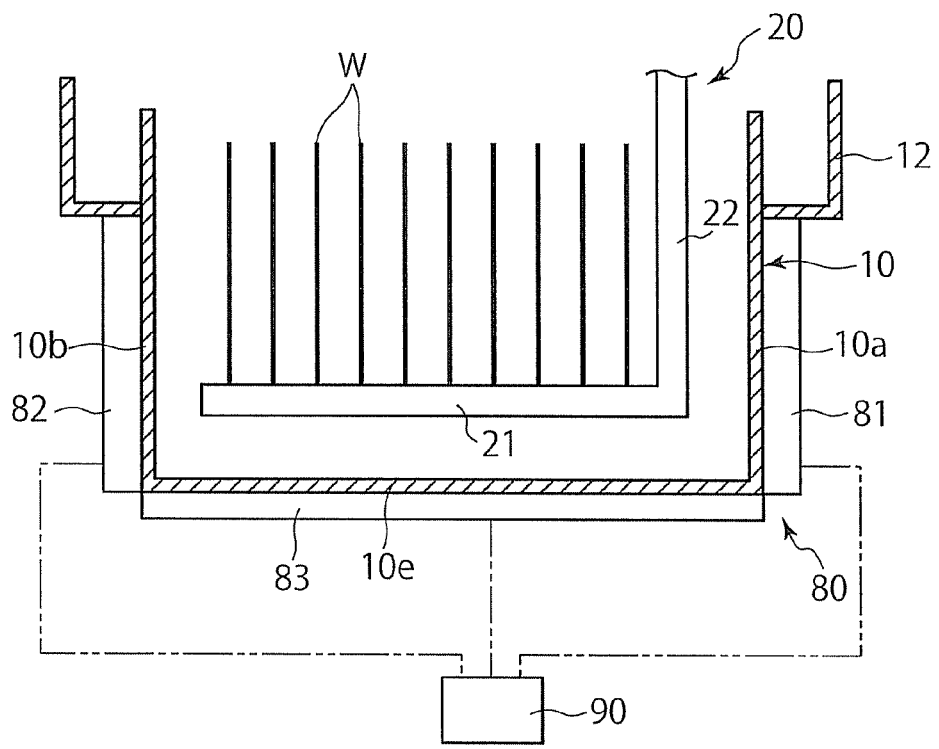
FIG. 3 is a side sectional view of the substrate processing apparatus in the first embodiment according to the present invention.

As shown in FIGS. 1 to 3, the substrate processing apparatus 1 includes a process tank 10 configured to store a chemical liquid (phosphoric acid solution, $H_3Po_4$) so as to process (etch) a plurality of (e.g., fifty) substrates (e.g., semiconductor wafers which are hereinafter referred to simply as "wafers") by the chemical liquid, and a wafer board (substrate holding mechanism) 20 capable of being loaded into the process tank 10, the wafer board 20 being configured to hold wafers W in a standing state and to immerse the wafers W into the chemical liquid. The process tank 10 includes a pair of opposed sidewalls, i.e., a first sidewall (one sidewall) 10a and a second sidewall (the other sidewall) 10b, two other sidewalls (a third sidewall 10c and a fourth sidewall 10d), and a bottom plate (bottom part) 10e. The process tank 10 is of a rectangular parallelepiped shape.

Cut grooves 11 are formed in upper parts of the respective sidewalls 10a, 10b, 10c and 10d of the process tank 10. The process tank 10 is formed of quartz. Disposed around the process tank (inner tank) 10 is a quartz outer tank 12 configured to receive the chemical liquid overflowing from the process tank 10. A heat insulation wall 13 formed of a heat insulation material (e.g., polytetrafluoroethylene (PTFE)) is located outside the outer tank 12 so as to prevent lowering of a temperature of the chemical liquid stored in the process tank 10, and to prevent radiation of heat to another apparatus (not shown) disposed around the process tank 10. A rectangular frame plate 14 is disposed on a lower surface of the process tank 10. Attachment frames 15 for supporting the heat insulation wall 13 are fixed on respective edges of the frame plate 14. The frame plate 14 and the attachment frames 15 are formed of the same material as that of the heat insulation wall 13.

As shown in FIG. 3, the wafer board 20 includes a holding rod (holding part) 21 configured to hold wafers W in a standing state (in a vertical state), and a back plate (back part) 22 connected to the holding rod 21 and extending vertically. When the wafer board 20 is loaded into the process tank 10, the back plate 22 is located close to the first sidewall 10a of the process tank 10 and is interposed between the wafers W held by the holding rod 21 and the first sidewall 10a. The back plate 22 is connected to a drive part, not shown, which vertically moves the wafer board 20. The drive part is connected to a control unit 90, which will be described below, and is driven based on a control signal from the control unit 90.

As shown in FIG. 1, disposed between the outer tank 12 and the process tank 10 is a circulation line 30 that circulates the chemical liquid having overflown from the process tank 10 to the process tank 10. Namely, one end of the circulation line 30 is connected to a discharge port 31 formed in a bottom part of the outer tank 12, and the other end thereof is connected to a supply port 32 formed in the bottom plate 10e of the process tank 10. The circulation line 30 is equipped with a circulation pump 33 that sends the chemical liquid from the discharge port 31 of the outer tank 12 to the supply port 32 of the process tank 10. A filter 34 is disposed in the circulation line 30 on a downstream side of the circulation pump 33 (on a side of the supply port 32), so that foreign matters such as particles contained in the chemical liquid passing through the circulation line 30 can be removed. Further, a temperature controller 35 is disposed on a downstream side of the filter 34, such that the chemical liquid passing through the circulation line 30 is heated to a temperature of about 160° C. to 180° C. so as to be boiled. The circulation pump 33 and the temperature controller 35 are connected to the control unit 90, and are controlled by the control unit 90.

Connected to the circulation line 30 through a dilution-liquid supply line 41 is a dilution-liquid supply source 40 that supplies a dilution liquid (e.g., deionized water) for diluting a chemical liquid to be supplied into the process tank 10. One end of the dilution-liquid supply line 41 is connected to the circulation line 30 at a position between the temperature controller 35 and the supply port 32, and the other end thereof is connected to the dilution-liquid supply source 40. In addition, the dilution-liquid supply line 41 is provided with a dilution-liquid opening and closing valve 42, whereby a flow rate of the dilution liquid passing through the dilution-liquid supply line 41 can be adjusted. The dilution-liquid opening and closing valve 42 is connected to the control unit 90, and is controlled by the control unit 90.

A discharge line 50 for discharging the chemical liquid from the process tank 10 is connected to the circulation line 30. Namely, one end of the discharge line 50 is connected to the circulation line 30 at a position on the downstream side of a point at which the circulation line 30 and the dilution-liquid supply line are merged to each other, and the other end thereof is connected to a discharge mechanism, not shown, for discharging the chemical liquid. The discharge line 50 is provided with a discharge opening and closing valve 51, whereby a flow rate of the chemical liquid discharged from the process tank 10 can be adjusted. The discharge opening and closing valve 51 is connected to the control unit 90, and is controlled by the control unit 90.

In the lower part of the process tank 10, there is disposed a rectifying plate 60 configured to guide the chemical liquid circulated and supplied from the supply port 32 so as to be uniformly dispersed toward the wafers W held by the wafer board 20. The rectifying plate 60 has elongated holes 61 for uniformly dispersing the chemical liquid. The elongated holes 61 are formed in parallel with each other, for example.

A chemical-liquid accommodating tank 70 accommodating a chemical liquid is disposed above the process tank 10. A chemical-liquid replenishment line 71 extends from a bottom part of the chemical-liquid accommodating tank 70 toward the process tank 10. The chemical-liquid replenishment line 71 is provided with a chemical-liquid replenishment opening and closing valve 72. By opening the chemical-liquid replenishment opening and closing valve 72, the chemical liquid can be supplied from the chemical-liquid accommodating tank 70 to the process tank 10. The chemical-liquid replenishment opening and closing valve 72 is connected to the control unit 90, and is controlled by the control unit 90.

As shown in FIG. 3, the process tank 10 is equipped with a heating device 80 for heating the chemical liquid in the process tank 10. An output of the heating device 80 on the side of the first sidewall 10 of the process tank 10 is larger than an output of the heating device 80 on the side of the second sidewall 10b.

Namely, the heating device 80 includes a first heater (first heating device) 81 disposed on the first sidewall 10a of the process tank 10, and a second heater (second heating device) 82 disposed on the second sidewall 10b of the process tank 10. An output of the first heater 81 is larger than an output of the second heater 82. Further, as shown in FIG. 1, third heaters (third heating device) 83 are disposed on the third sidewall 10c, the fourth sidewall 10d and the bottom plate 10e of the process tank 10. The heaters 81, 82 and 83 are configured to heat the chemical liquid in the process tank 10 into the boiling state. As shown in FIGS. 1 and 3, the respective heaters 81, 82 and 83 are connected to the control unit 90, and are controlled based on a control signal from the control unit 90. The respective third heaters 83 are collectively operated by the control unit 90.

As described above, connected to the respective heaters 81, 82 and 83 of the heating device 80 is the control unit 90 that controls these heaters 81, 82 and 83. The control unit 90 controls the first heater 81 and the second heater 82 such that an output of the first heater 81 is larger than an output of the second heater 82, and that the output of the first heater 81 and the output of the second heater 82 are maintained constant. For example, the control unit 90 can vary the outputs of the respective heaters 81 and 82 by varying values of currents to be supplied to the respective heaters 81 and 82.

A temperature sensor (temperature detecting device) 85 configured to detect a temperature of the chemical liquid stored in the process tank 10 is disposed in the process tank 10. The control unit 90 is connected to the temperature sensor 85. The control unit 90 controls the third heaters 83 by turning on or off the third heaters 83 based on a temperature detected by the temperature sensor 85. In this manner, the chemical liquid stored in the process tank 10 is heated to a desired temperature, i.e., to a temperature at which the chemical liquid boils (about 160° C. to about 180° C.).

In addition, the control unit 90 controls the first heater 81 and the third heaters 83 such that outputs of the third heaters 83 are substantially the same as the output of the first heater 81.

The outer tank 12 is equipped with a concentration sensor 86 configured to detect a concentration of silicon (Si) that is dissolved in the overflowing chemical liquid by an etching process. Further, in the process tank 10, there is disposed a liquid level sensor 87 configured to detect a liquid level of the stored chemical liquid. The concentration sensor 86 and the liquid level sensor 87 are respectively connected to the control unit 90. The control unit 90 controls the dilution-liquid opening and closing valve 42, the discharge opening and closing valve 51 and the chemical-liquid replenishment opening and closing valve 72, based on detection signals from the concentration sensor 86 and the liquid level sensor 87.

As shown in FIG. 1, connected to the control unit 90 are a keyboard by which a process manager can input a command and so on in order to manage the substrate processing apparatus 1, and an input/output device 91 formed of a display which can visualize an operation condition or the like of the substrate processing apparatus 1. The control unit 90 is accessible to a storage medium 92 storing a program for realizing a process performed by the substrate processing apparatus 1. The storage medium 92 can be constituted by a known storage medium, for example, by a memory such as a ROM and a RAM, and a disc-shaped storage medium such as a hard disc, a CD-ROM, a DVD-ROM and a flexible disc. When the control unit 90 executes the program or the like that is previously stored in the storage medium 92, wafers W can be processed in the substrate processing apparatus 1.

Next, an operation of the embodiment as structured above, i.e., a substrate processing method by this embodiment is described. The below-described operations of the respective constituent elements for performing the substrate processing method are controlled by control signals from the control unit 90 based on the program that is previously stored in the storage medium 92.

Figure 4:
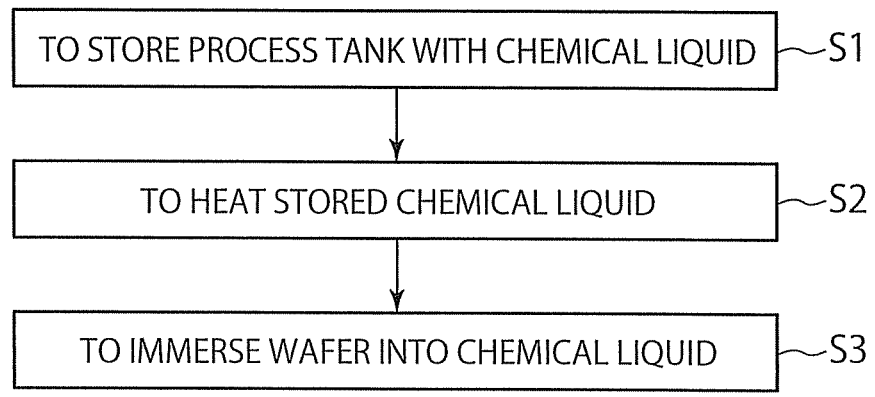
FIG. 4 is a flowchart of a substrate processing method in the first embodiment according to the present invention.

At first, as shown in FIG. 4, the process tank 10 is stored with a chemical liquid (step S1). In this case, the chemical-liquid replenishment opening and closing valve 72 is opened, so that the chemical liquid is supplied from the chemical-liquid accommodating tank 70 to the process tank 10 through the chemical-liquid replenishment line 71. At this time, the chemical liquid is supplied until the chemical liquid overflows from the process tank 10 to the outer tank 12.

Then, the first heater 81, the second heater 82 and the third heaters 83 of the heating device 80 disposed in the process tank 10 are operated, so that the chemical liquid stored in the process tank 10 is heated (step S2). In this case, the first heater 81, the second heater 82 and the third heaters 83 are operated such that an output of the first heater 81 is larger than an output of the second heater 82, that the output of the first heater 81 and the output of the second heater 82 are respectively maintained constant, and that outputs of the respective third heaters 83 are substantially the same as the output of the first heater 81. During this operation, a temperature of the chemical liquid stored in the process tank 10 is detected by the temperature sensor 85. Based on the detected temperature, the respective third heaters 83 are turned on or off.

After the chemical liquid has been stored in the process tank 10, the circulation pump 33 is driven. Thus, the chemical liquid circulates in the following manner. Namely, the chemical liquid having overflown to the outer tank 12 flows from the discharge port 31 of the outer tank 12 toward the supply port 32 of the process tank 10 through the circulation line 30 so as to be returned to the process tank 10. The chemical liquid passing through the circulation line 30 is heated by the temperature controller 35, whereby lowering of the temperature of the chemical liquid returning to the process tank 10 is prevented.

In this manner, the chemical liquid stored in the process tank 10 is heated with the temperature thereof on the side of the first heater 81 being higher than the temperature thereof on the side of the second heater 82, to a temperature at which the chemical liquid boils (about 160° C. to 180° C.). As a result, the chemical liquid stored in the process tank 10 boils.

Then, wafers W are immersed in the heated chemical liquid for a predetermined period of time (step S3). In this case, the plurality of wafers W each having a silicon nitride film formed on a surface thereof are firstly transferred by a transfer mechanism, not shown, and are received by the wafer board 20 such that the wafers are held by the holding rod 21 of the wafer board 20 in a standing state. Then, the not-shown drive part is driven so as to load the wafer board 20 into the process tank 10, so that the respective wafers W are immersed into the chemical liquid.

While the wafers W are being immersed in the chemical liquid, the first heater 81 and the second heater 82 are operated, and the third heaters 83 are operated based on the temperature of the chemical liquid detected by the temperature sensor 85, similarly to the aforementioned step S2.

Thus, the silicon nitride film on the surface of each wafer W is etched and formed into a desired pattern.

While the wafers W are being immersed in the chemical liquid, the back plate 22 of the wafer board 20 is located close to the first heater 81 disposed on the first sidewall 10a of the process tank 10, and is interposed between the wafers W held by the holding rod 21 and the first heater 81. Before the wafers W are immersed into the chemical liquid, the temperature of the chemical liquid stored in the process tank 10 on the side of the first heater 81 is higher than the temperature of the chemical liquid on the side of the second heater 82. In addition, while the wafers W are being immersed in the chemical liquid, the first heater 81 and the second hater 82 are operated such that the output of the first heater 81 is larger than the output of the second heater 82. Thus, even when the wafer board 20 is loaded into the process tank 10 so that the wafers W are immersed into the chemical liquid, lowering of the temperature of the chemical liquid around the wafers W held near to the back plate 22 can be prevented, whereby the temperature of the chemical liquid in the process tank 10 and the boiling state thereof can be made uniform.

While the wafers W are being immersed in the chemical liquid, the circulation pump 33 is driven so as to circulate the chemical liquid. Thus, silicon particles generated by the etching process of the silicon nitride film of each wafer W can be removed by the filter 34 disposed in the circulation line 30.

In addition, during this operation, a concentration of silicon dissolved in the chemical liquid having overflown from the process tank 10 by the etching process is detected by the concentration sensor 86 disposed on the outer tank 12. When the detected concentration of silicon reaches a desired concentration, the concentration of silicon in the chemical liquid is lowered in the following manner. Namely, the discharge opening and closing vale 51 is firstly opened, and a part of the chemical liquid stored in the process tank 10 is discharged through the discharge line 50. At this time, a liquid surface of the chemical liquid stored in the process tank 10 is lowered. Then, when the liquid level of the chemical liquid is lowered to a predetermined position, the liquid level sensor 87 transmits a detection signal to the control unit 90. Based on the detection signal from the liquid level sensor 87, the control unit 90 closes the discharge opening and closing valve 51 and opens the chemical-liquid replenishment valve 72, so that a chemical liquid accommodated in the chemical-liquid accommodating tank 70 is replenished (supplied) to the process tank 10 through the chemical-liquid replenishment line 71. Thus, the concentration of silicon in the chemical liquid stored in the process tank 10 can be lowered. Alternatively, when the concentration of silicon in the chemical liquid is higher than the desired concentration, the control unit 90 may lower the concentration of silicon stored in the process tank 10 in the following manner. Namely, the control unit 90 opens the dilution-liquid opening and closing valve 42, so that a dilution liquid is supplied from the dilution-liquid supply source 40 to the process tank 10 through the dilution-liquid supply line 41.

After the etching process of the wafers W has been finished, the wafer board 20 is elevated by the not-shown drive part, so that the etched wafers W are unloaded from the process tank 10. Thereafter, the wafers W are transferred to the not-shown transfer mechanism.

By repeating the above steps, a plurality of wafers W can be sequentially subjected to the etching process in the process tank 10.

According to this embodiment, the chemical liquid stored in the process tank 10 is heated by the first heater 81 and the second heater 82 such that the output of the first heater 81 is larger than the output of the second heater 82. Thus, during the etching process, lowering of the temperature of the chemical liquid around the wafers W held near to the back plate 22 of the holding rod 21 of the wafer board 20 can be prevented, whereby the temperature and the boiling state of the chemical liquid in the process tank 10 can be made uniform. Therefore, etching rates of the respective wafers W can be made uniform, so that the silicon nitride films on the surfaces of the respective wafers W can be uniformly etched. That is to say, the temperature and the boiling state of the chemical liquid in the process tank 10 can be made uniform during the etching process, whereby the plurality of wafers W can be uniformly etched.

In addition, according to this embodiment, the third heaters 83 are operated such that the chemical liquid stored in the process tank 10 is heated to a temperature at which the chemical liquid boils, while the output of the first heater 81 and the output of the second heater 82 are respectively maintained constant, and the outputs of the third heaters 83 are substantially the same as the output of the first heater 81. Thus, the temperature and the boiling state of the chemical liquid stored in the process tank 10 can be uniformly maintained when the wafers W are subjected to the etching process. Further, since the third heaters 83 are turned on or off based on the temperature of the chemical liquid in the process tank 10, which is detected by the temperature sensor 85, the chemical liquid stored in the process tank 10 can be maintained in the boiling state with a high precision.

Although the embodiment of the present invention has been described above, the present invention can be variously modified within the scope of the present invention. Herebelow, typical modification examples will be described.

In this embodiment, the output of the first heater 81 and the output of the second heater 82 are respectively maintained constant, and the respective third heaters 83 are turned on or off such that the temperature of the stored chemical liquid becomes a temperature at which the chemical liquid boils. However, not limited to this example, the outputs of the respective heaters 83 may be constantly maintained at a predetermined value, and the first heater 81 and the second heater 82 may be turned on or off such that the output of the first heater 81 is larger than the output of the second heater 82, and that the temperature of the stored chemical liquid becomes a predetermined temperature. In this case, even when the wafers W are immersed into the chemical liquid, the temperature and the boiling state of the chemical liquid stored in the process tank 10 can be uniformly maintained. Also in this case, the first heater 81 and the second heater 82 may be turned on or off based on the temperature of the chemical liquid in the process tank 10, which is detected by the temperature sensor 85. In this case, the chemical liquid stored in the process tank 10 can be maintained in the boiling state with a high precision.

In addition, in this embodiment, the control unit 90 controls the first heater 81 and the third heaters 83 such that the outputs of the third heaters 83 are substantially the same as the output of the first heater 81. However, not limited to this example, the control unit 90 may control the first heater 81 and the third heaters 83 such that the outputs of the third heaters 83 are larger than the output of the first heater 81. In this case, since the outputs of the third heaters 83, which are controlled based on a temperature detected by the temperature sensor 85, are larger than the output of the first heater 81, the chemical liquid stored in the process tank 10 can be maintained in the boiling state with a higher precision.

In addition, in this embodiment, the third heaters 83 are controlled based on a temperature detected by the temperature sensor 85. However, not limited to this example, the chemical liquid may be heated by operating the third heaters 83 without using the temperature sensor 85. Also in this case, the chemical liquid stored in the process tank 10 can be heated into the boiling state.

In addition, in this embodiment, the concentration sensor 86 for detecting a concentration of the overflowing chemical liquid is disposed on the outer tank 12, and the liquid level sensor 87 for detecting a liquid level of the stored chemical liquid is disposed in the process tank 10, whereby a concentration of silicon in the chemical liquid can be adjusted. However, not limited to this example, at least one of the concentration sensor 86 and the liquid level sensor 87 may be omitted, and a concentration of silicon in the chemical liquid may be adjusted by another method. For example, it is possible to obtain by an experiment the number of processes, the process time, or the number of processed wafers by which a concentration of silicon in the chemical liquid exceeds a predetermined concentration range. In this case, for each time the number of processes, the process period, or the number of processed wafers reaches the obtained one, a concentration of silicon in the chemical liquid is adjusted.

Moreover, in this embodiment, the heating device 80 includes the first heater 81 and the second hater 82, and the output of the first heater 81 is larger than the output of the second heater 82. However, not limited to this example, the third heater 83 disposed on the bottom plate 10e of the process tank 10 may be divided into a plurality of heaters, and the stored chemical liquid may be heated, with an output of the third heater 83 on the side of the first sidewall 10a being larger than an output of the third heater 83 on the side of the second sidewall 10b. Also in this case, lowering of temperature of the chemical liquid around the wafers W held near to the back plate 22 of the holding rod 21 of the wafer board 20 can be prevented, whereby the temperature and the boiling state of the chemical liquid in the process tank 10 can be made uniform during the etching process. Alternatively, the respective third heaters 83 disposed on the third sidewall 10c and the fourth sidewall 10d of the process tank 10 may be divided into a plurality of heaters, and the stored chemical liquid may be heated with an output of the third heater 83 on the side of the third sidewall 10c being larger than an output of the third heater 83 on the side of the fourth sidewall 10d.

Second Embodiment

Next, a substrate processing apparatus in a second embodiment according to the present invention, a substrate processing method, and a storage medium storing a computer program for performing the substrate processing method will be described with reference to FIGS. 5 to 7.

Figure 5:
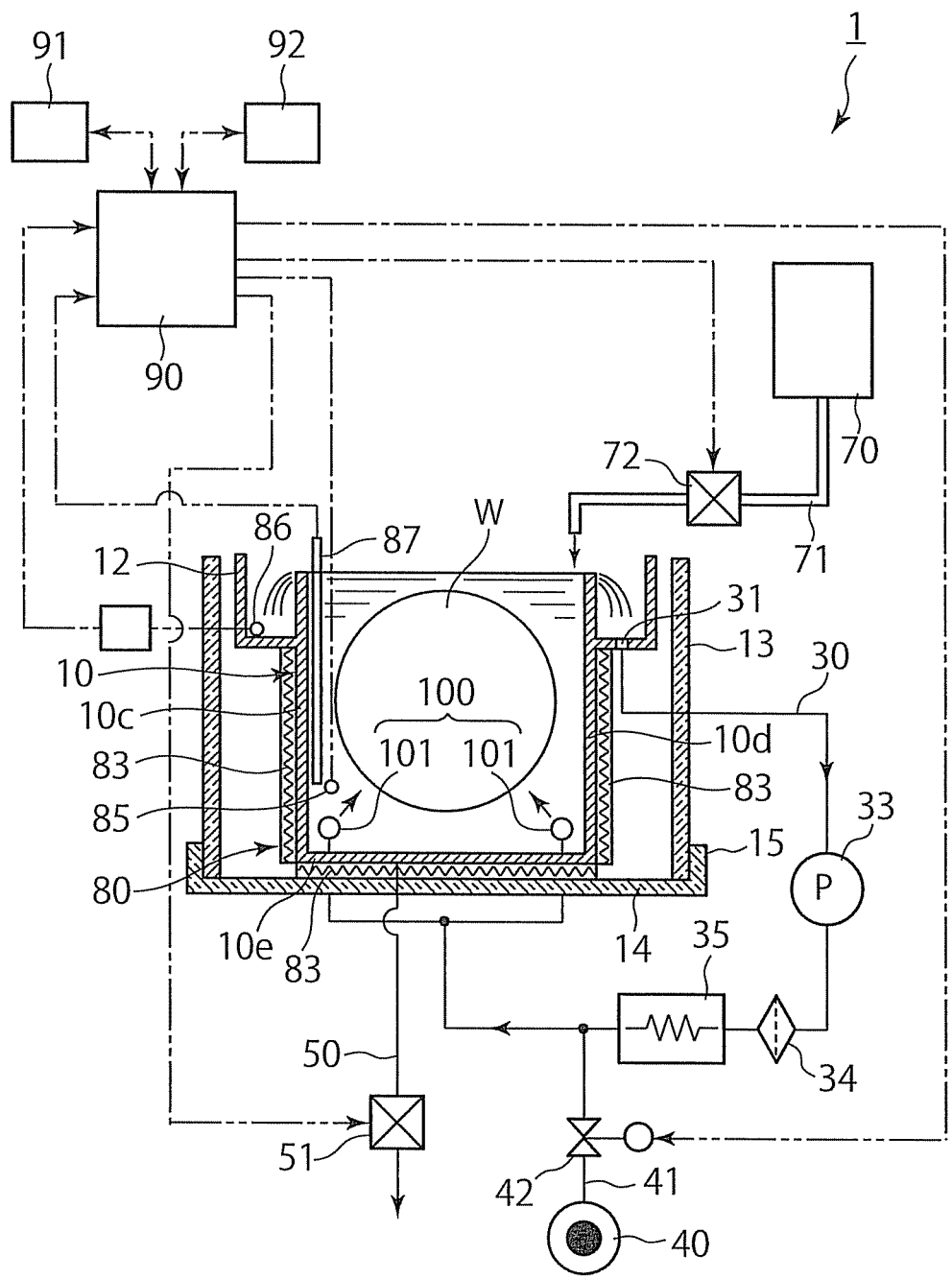
FIG. 5 is a view showing an overall structure of a substrate processing apparatus in a second embodiment according to the present invention.
Figure 6:
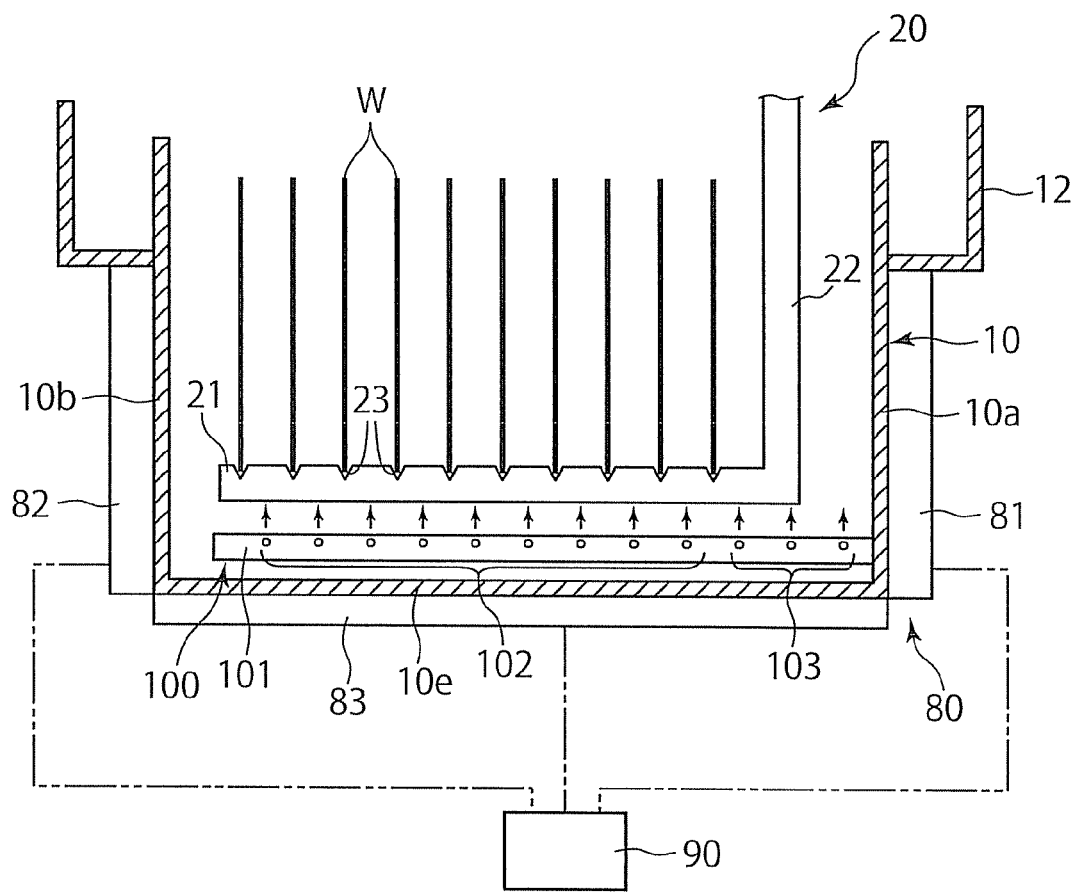
FIG. 6 is a side sectional view of the substrate processing apparatus in the second embodiment according to the present invention.
Figure 7:
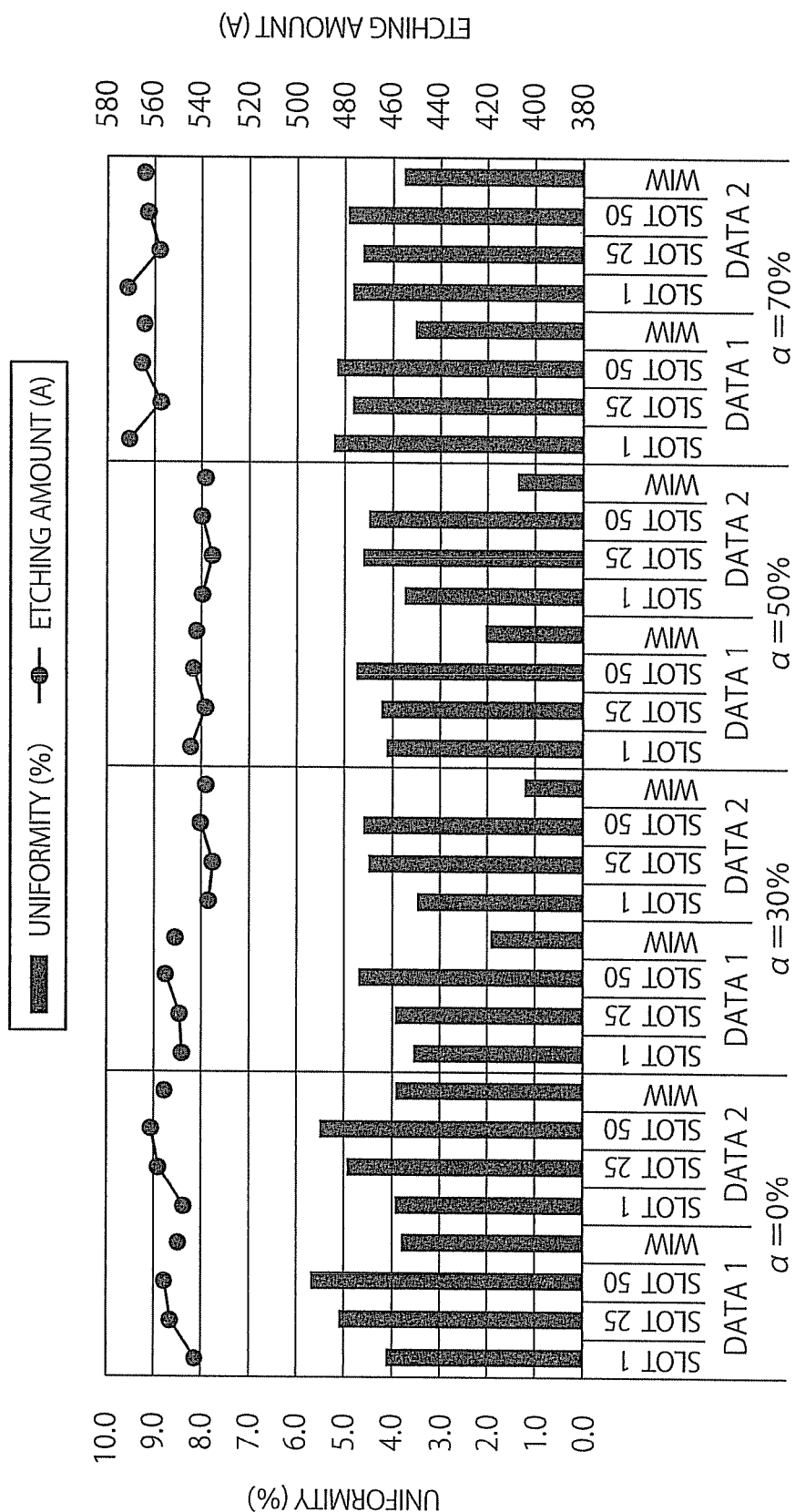
FIG. 7 is a view showing an etching uniformity and an etching amount in the substrate processing apparatus in the second embodiment according to the present invention.

The second embodiment shown in FIGS. 5 to 7 differs from the first embodiment shown in FIGS. 1 to 4 in that there are provided a chemical-liquid supply part including a plurality of substrate position supply holes arranged so as to correspond to gaps between holding grooves, and a back-plate side supply hole arranged so as to correspond to a gap between the holding groove, which is formed closest to a back part among these holding grooves, and one sidewall, and in that a first heating device and a second heating device are controlled such that an output of the first heating device is smaller than an output of the second heating device. Other structures of the second embodiment are substantially the same as those of the first embodiment. In FIGS. 5 to 7, the same parts as those of the first embodiment shown in FIGS. 1 to 4 are shown by the same reference numbers, and detailed description thereof is omitted.

As shown in FIGS. 5 and 6, a chemical-liquid supply part 100 configured to supply a chemical liquid to wafers W immersed in a chemical liquid is disposed in a process tank 10. As shown in FIG. 6, a plurality of holding grooves 23 capable of being engaged with wafers W are formed in a holding rod 21 of a wafer board 20, whereby respective wafers W can be held by engaging the wafers W with the holding grooves 23.

The chemical-liquid supply part 100 includes: two chemical-liquid supply nozzles 101 extending substantially horizontally along a third sidewall 10c and a fourth sidewall 10d, which are opposed to each other, of the process tank 10; and a plurality of wafer position supply holes (substrate position supply holes) 102 and a plurality of back-plate side supply holes (back-part side supply holes) 103, which are formed in the respective chemical-liquid supply nozzles 101. The wafer position supply holes 102 are linearly arranged in the respective chemical-liquid supply nozzles 101 so as to correspond to gaps between the holding grooves 23 formed in the holding rod 21 of the wafer board 20. The wafer position supply holes 102 are configured to spout (supply) a chemical liquid to gaps between wafers W immersed in the chemical liquid. The back-plate side supply holes 103 are linearly arranged so as to correspond to a gap between the holding groove 23, which is formed closest to the back plate 22 among these holding grooves 23, and the first sidewall 10a. The back-plate side supply holes 103 are configured to supply the chemical liquid to a gap between the wafer W, which is engaged with the holding groove 23 located closest to the back plate 22, and the first sidewall 10a. Alternatively, the number of the back-plate side supply holes 103 formed in each chemical-liquid supply nozzle 101 may be one. As shown in FIG. 5, the wafer position supply holes 102 and the back-plate side supply holes 103 are structured such that the chemical liquid is spouted therefrom toward the wafers W in diagonally upward directions.

As shown in FIG. 5, one end of a circulation line 30 in this embodiment is connected to a discharge port 31 formed in a bottom part of an outer tank 12, and the other end thereof is diverged and connected to the respective chemical-liquid supply nozzles 101 of the chemical-liquid supply part 100 disposed in the process tank 10. A circulation pump 33 disposed on the circulation line 30 is configured to send a chemical liquid from the discharge port 31 of the outer tank 12 to the respective chemical-liquid supply nozzles 101. Thus, the chemical liquid circulates in the following manner. Namely, the chemical liquid having overflown to the outer tank 12 flows from the discharge port 31 of the outer tank 12 toward the respective chemical-liquid supply nozzles 101 of the chemical-liquid supply part 100 through the circulation line 30 so as to be returned to the process tank 10. At this time, the chemical liquid is supplied from the wafer position supply holes 102 formed in the respective chemical-liquid supply nozzles 101 to the gaps between the wafers W, and the chemical liquid is supplied from the back-plate side supply holes 103 to the gap between the wafer W, which is engaged with the holding groove 23 located closest to the back plate 22 among the plurality of holding grooves 23 formed in the holding rod 21 of the wafer board 20, and the first sidewall 10a. In this embodiment, a discharge line 50 is connected to the process tank 10, and the chemical liquid is discharged from the process tank 10 by the discharge line 50 when the chemical liquid in the process tank 10 is replaced.

In this embodiment, a control unit 90 controls a first heater 81 and a second heater 82 of a heating device 80 such that an output of the first heater 81 is smaller than an output of the second heater 82, and that the output of the first heater 81 and the output of the second heater 82 are maintained constant. In particular, it is preferable that the first heater 81 and the second heater 82 are controlled such that the output of the first heater 81 relative to the second heater 82 is 30% to 50%. The control unit 90 controls third heaters 83 such that the third heaters 83 are turned on or off based on a temperature detected by a temperature sensor 85. In this manner, the chemical liquid stored in the process tank 10 is heated to a desired temperature, i.e., to a temperature at which the chemical liquid boils (about 160° C. to about 180° C.). In addition, the control unit 90 controls the first heater 81 and the third heaters 83 such that outputs of the third heaters 83 are substantially the same as the output of the first heater 81.

According to this embodiment, while the wafers W are being immersed in the chemical liquid, the chemical liquid is supplied from the back-plate side supply holes 103 disposed in the respective chemical-liquid supply nozzles 101 of the chemical-liquid supply part 100 to the gap between the holding groove 23, which is located closest to the back plate 22 among the plurality of holding grooves 23 formed in the holding rod 21 of the wafer board 20, and the first sidewall 10a. Thus, the chemical liquid can be supplied to the gap between the wafer W, which is located closest to the back plate 22 among the plurality of wafers W held by the holding rod 21, and the first sidewall 10a, so that lowering of the chemical liquid around the back plate 22 of the wafer board 20 can be prevented whereby the temperature and the boiling state of the chemical liquid in the process tank 10 can be made uniform. Therefore, an etching rate of the wafer W located on the side of the back plate 22 can be improved. As a result, etching rates of the respective wafers W can be made uniform, so that the silicon nitride films on the surfaces of the respective wafers W can be uniformly etched. That is to say, the temperature and the boiling state of the chemical liquid in the process tank 10 can be made uniform during the etching process, whereby the plurality of wafers W can be uniformly etched.

In addition, according to this embodiment, the chemical liquid stored in the process tank 10 is heated by the first heater 81 and the second heater 82 such that the output of the first heater 81 is smaller than the output of the second heater 82, in particular, the output of the first heater 81 relative to the second heater 82 is 30 to 50%. Thus, as described below with reference to FIG. 7, the silicon nitride films on the surfaces of the respective wafers W can be more uniformly etched, whereby the plurality of wafer W can be more uniformly etched.

An etching uniformity and an etching amount of wafers W that have been processed by a chemical liquid in accordance with this embodiment are shown in FIG. 7. Herein, rates (a) of the output of the first heater 81 relative to the second heater 82 were 0%, 30%, 50% and 70%. For each case, an etching uniformity and an etching amount of some of wafers W held by the holding rod 21 of the wafer board 20 are shown. "Slot 1" shows data of the wafer W which was engaged with the holding groove 23 formed closest to the second sidewall 10b among the holding grooves 23 formed in the holding rod 21. "Slot 25" shows data of the wafer W which was engaged with the holding groove 23 located on a center portion of the plurality of holding grooves 23. "Slot 50" shows data of the wafer W which was engaged with the holding groove 23 formed closest to the back plate 22 among the plurality of holding grooves 23. "WIW" shows a uniformity of etching amounts on a plurality of points on the surface of the wafer W.

In view of FIG. 7, it can be confirmed that the etching uniformity of the respective wafers W is improved, when the output of the first heater 81 is smaller than the output of the second heater 82, in particular, when α is between 30% and 50%. In addition, an etching amount generally tends to be significantly impaired when an etching uniformity is improved. However, in view of FIG. 7, it can be confirmed that significant impairment of the etching amount is restrained, while the etching uniformity is improved. In FIG. 7, the etching uniformity and the etching amount of the respective wafers W obtained by the chemical-liquid process under the same condition are shown by "Data 1" and "Data 2". In view of Data 1 and Data 2, reliability of an effect of improving the etching uniformity and an effect of restraining lowering of the etching amount can be confirmed.

Similarly to the first embodiment, the aforementioned second embodiment can be variously modified within the scope of the present invention.

In the above description, the substrate processing method of the present invention, the storage medium 92 storing a computer program for performing the substrate processing method, and the substrate processing apparatus 1 are applied to an etching process of semiconductor wafers W. However, not limited to this example, the present invention can be applied to an etching process of various other substrates, such as LCD substrates or CD substrates.

The invention claimed is:

1. A substrate processing apparatus comprising:
    a process tank including a pair of opposed sidewalls, the process tank being configured to store a chemical liquid therein and to process a plurality of substrates by the chemical liquid;
    a substrate holding mechanism including a holding part configured to hold the plurality of substrates vertically, and a back part connected to the holding part, the back part being interposed between the substrates held by the holding part and one sidewall of the pair of opposed sidewalls of the process tank when the substrate holding mechanism is loaded into the process tank, the substrate holding mechanism being configured to immerse the substrates held by the holding part into the chemical liquid; and
    a heating device disposed on the process tank, the heating device being configured to heat the stored chemical liquid;
    wherein
    the heating device includes a first heating device disposed on the one sidewall of the process tank, and a second heating device disposed on the other sidewall thereof,
    a control unit is connected to the first heating device and the second heating device,
    the control unit is configured to independently control an energy output of the first heating device and an energy output of the second heating device, the control unit is configured to control the first heating device and the second heating device by varying values of currents provided to the first heating device and the second heating device such that the energy output of the first heating device is larger than the energy output of the second heating device, so as to heat the chemical liquid stored in the process tank, and
    when the substrate holding mechanism is loaded into the process tank, the back part is interposed between the substrates held by the holding part and the first heating device.

2. The substrate processing apparatus according to claim 1, wherein:
    the process tank further includes two other sidewalls and a bottom part;
    third heating devices are disposed respectively on the two other sidewalls and the bottom part of the process tank; and
    the control unit is configured to control the first heating device and the second heating device such that the energy output of the first heating device and the energy output of the second heating device are respectively maintained constant, and to control the third heating devices such that a temperature of the chemical liquid stored in the process tank becomes a desired temperature.

3. The substrate processing apparatus according to claim 2, wherein
    a temperature detecting device configured to detect the temperature of the stored chemical liquid is disposed in the process tank, and
    the control unit is configured to control the third heating devices based on the temperature detected by the temperature detecting device.

4. The substrate processing apparatus according to claim 2, wherein the control unit is configured to control the first heating device and the third heating devices such that energy outputs of the third heating devices are substantially the same as the energy output of the first heating device.

5. The substrate processing apparatus according to claim 2, wherein the control unit is configured to control the first heating device and the third heating devices such that energy outputs of the third heating devices are larger than the energy output of the first heating device.

6. The substrate processing apparatus according to claim 1, wherein:
    the process tank further includes two other sidewalls and a bottom part;
    third heating devices are disposed respectively on the two other sidewalls and the bottom part of the process tank; and
    the control unit is configured to control the third heating devices such that energy outputs of the third heating devices are maintained constant and to control the first heating device and the second heating device such that a temperature of the chemical liquid stored in the process tank becomes a desired temperature.

7. The substrate processing apparatus according to claim 6, wherein
    a temperature detecting device configured to detect the temperature of the stored chemical liquid is disposed in the process tank, and
    the control unit is configured to control the first heating device and the second heating device based on the temperature detected by the temperature detecting device.

8. The substrate processing apparatus according to claim 6, wherein the control unit is configured to control the first heating device and the third heating devices such that the energy outputs of the third heating devices are substantially the same as the energy output of the first heating device.

9. The substrate processing apparatus according to claim 6, wherein the control unit is configured to control the first heating device and the third heating devices such that the energy outputs of the third heating devices are larger than the energy output of the first heating device.

10. A substrate processing apparatus comprising:
    a process tank including a pair of opposed sidewalls, the process tank being configured to store a chemical liquid therein and to process a plurality of substrates by the chemical liquid;
    a substrate holding mechanism including a holding part configured to hold the plurality of substrates vertically, and a back part connected to the holding part, the back part being interposed between the substrates held by the holding part and one sidewall of the pair of opposed sidewalls of the process tank when the substrate holding mechanism is loaded into the process tank, the substrate holding mechanism being configured to immerse the substrates held by the holding part into the chemical liquid; and a heating device disposed on the process tank, the heating device being configured to heat the stored chemical liquid;

a chemical-liquid supply part disposed in the process tank, the chemical-liquid supply part being configured to supply the chemical liquid to the substrates immersed in the chemical liquid, wherein the heating device includes a first heating device disposed on the one sidewall of the pair of opposed sidewalls of the process tank, and a second heating device disposed on the other sidewall thereof, a control unit is connected to the first heating device and the second heating device, the control unit is configured to independently control an energy output of the first heating device and an energy output of the second heating device by varying values of currents provided to the first heating device and the second heating device;

a plurality of holding grooves capable of being engaged with the substrates are formed in the holding part of the substrate holding mechanisms, and the chemical-liquid supply part includes: a plurality of substrate position supply holes arranged so as to correspond to gaps between the holding grooves, the substrate position supply holes being configured to supply the chemical liquid to the gaps between the substrates; and a back-part side supply hole arranged so as to correspond to a gap between the holding groove, which is formed closest to the back part among the plurality of holding grooves, and the one sidewall, the back-part side supply hole being configured to supply the chemical liquid to the gap between the substrate, which is engaged with the holding groove located closest to the back part, and the one sidewall.

11. A substrate processing apparatus comprising:

a process tank including a pair of opposed sidewalls, the process tank being configured to store a chemical liquid therein and to process a plurality of substrates by the chemical liquid;

a substrate holding mechanism including a holding part configured to hold the plurality of substrates vertically, and a back part connected to the holding part, the back part being interposed between the substrates held by the holding part and one sidewall of the pair of opposed sidewalls of the process tank when the substrate holding mechanism is loaded into the process tank, the substrate holding mechanism being configured to immerse the substrates held by the holding part into the chemical liquid; and a heating device disposed on the process tank, the heating device being configured to heat the stored chemical liquid;

wherein the heating device includes a first heating device disposed on the one sidewall of the process tank, and a second heating device disposed on the other sidewall thereof, a control unit is connected to the first heating device and the second heating device, wherein the control unit is configured to independently control an energy output of the first heating device and an energy output of the second heating device by varying values of currents provided to the first heating device and the second heating device such that the energy output of the first heating device is smaller than the energy output of the second heating device, so as to heat the chemical liquid stored in the process tank, and when the substrate holding mechanism is loaded into the process tank, the back part is interposed between the substrates held by the holding part and the first heating device.

12. The substrate processing apparatus according to claim 11, wherein the control unit controls the first heating device and the second heating device such that the energy output of the first heating device relative to the energy output of the second heating device is 30% to 50%.

\* \* \* \* \*